United States Patent [19]
Ashby

[11] Patent Number: 6,029,060
[45] Date of Patent: Feb. 22, 2000

[54] MIXER WITH CURRENT MIRROR LOAD

[75] Inventor: Kirk B. Ashby, Reading, Pa.

[73] Assignee: Lucent Technologies Inc., Murray Hill, N.J.

[21] Appl. No.: 08/895,065

[22] Filed: Jul. 16, 1997

[51] Int. Cl.$^7$ ...................................................... H04B 1/16
[52] U.S. Cl. ........................... 455/326; 330/227; 323/315
[58] Field of Search ..................................... 455/326, 314, 455/121, 122, 278.1, 333; 323/315; 327/355, 356, 359, 101; 332/123, 124, 159, 160, 161; 329/350, 351, 353

[56] References Cited

U.S. PATENT DOCUMENTS

| | | | |
|---|---|---|---|
| 3,838,262 | 9/1974 | Plassche | 235/194 |
| 4,739,282 | 4/1988 | Scheinberg | 330/227 |
| 5,414,383 | 5/1995 | Cusdin et al. | 329/304 |
| 5,512,816 | 4/1996 | Lambert | 323/315 |
| 5,630,228 | 5/1997 | Mittel | 455/326 |
| 5,652,743 | 7/1997 | Bien et al. | 327/359 |
| 5,847,556 | 12/1998 | Kothandaraman et al. | 323/315 |

OTHER PUBLICATIONS

"A DC to 1–GHz Differential Monolithic Variable–Gain Amplifier," by Robert G. Meyer and William D. Mack, IEEE Journal of Solid–State Circuits, vol. 26, No. 11, Nov. 1991, pp. 1673–1680.

"A Direct–Conversion Receiver for 900MHz (ISM Band) Spread–Spectrum Digital Cordless Telephone," by Christopher Dennis Hull, Robert Ray Chu, and Joo Leong Tham, ISSCC96/Session21/Wireless Systems/Paper SP 21.3, 1996 IEEE International Solid–State Circuits Conference, 5 pages.

*Primary Examiner*—Wellington Chin
*Assistant Examiner*—Isaak R. Jama

[57] ABSTRACT

A multi-stage mixer circuit has two or more mixer stages, each stage having a mixer core and successive mixer cores being separated by one or more current mirrors. By using current mirrors to process the currents generated by the mixer cores, instead of current-to-voltage and voltage-to-current converters as in the prior art, the present invention provides a mixer circuit with reduced signal distortion and power dissipation. In one embodiment, the two mixer cores of a two-stage mixer circuit are implemented using the same type of transistor devices (e.g., N-type), and there are two current mirrors between the mixer cores. In another embodiment, the two mixer cores of a two-stage mixer circuit are implemented using different types of transistor devices (i.e., one N-type and the other P-type), and there is only one current mirror between the mixer cores. A mixer circuit of the present invention may have an initial voltage-to-current converter to convert an input voltage signal into a current for the first mixer core. A mixer circuit of the present invention may also have a current-to-voltage converter to convert the current generated by the last mixer core into an output voltage signal. Alternatively, the last mixer core could be followed by a final current mirror that mirrors the current generated by the last mixer core.

37 Claims, 5 Drawing Sheets

MIXER WITH CURRENT MIRROR LOAD

BACKGROUND OF THE INVENTION

1. Field of the Invention

The present invention relates to electrical signal processing, and, in particular, to mixers used for frequency conversion.

2. Description of the Related Art

A mixer is a device that converts electrical signals from one frequency range to another frequency range. Series of two or more mixers are typically used in radio architectures, for example, during transmit processing, to convert signals from a baseband frequency range to an intermediate frequency (IF) range (e.g., 50–500 MHz) and from the IF range to a radio frequency (RF) range. In addition, series of two or more mixers may be used, during receive processing, to convert signals from the RF range to the IF range and from the IF range to the baseband frequency range.

FIG. 1 shows a schematic diagram of a prior-art mixer circuit 100 used to convert an input voltage signal Vin in an input frequency range into an output voltage signal Vout2 in an output frequency range. Mixer circuit 100 consists of a sequence of two mixer stages, where each mixer stage has a voltage-to-current (V-I) converter 102, a mixer core 104, and a current-to-voltage (I-V) converter 106.

V-I converter 102a converts the input voltage signal Vin into a current. Mixer core 104a mixes (i.e., multiplies) the current from converter 102a with a first local-oscillator signal LO1, and I-V converter 106a converts the resulting current into an intermediate voltage signal Vout1. Similarly, V-I converter 102b converts the intermediate voltage signal Vout1 into a current, mixer core 104b mixes the current from converter 102b with a second local-oscillator signal LO2, and I-V converter 106b converts the resulting current into the output voltage signal Vout2.

One of the problems with mixer circuit 100 is that each step of converting signals from voltage to current adds distortion to the signal stream that may ultimately adversely affect the fidelity of the information carried by the signal stream. Another problem is that each mixer stage usually adds gain, so that each successive voltage-to-current conversion must consume more power than the previous conversion in order to maintain the same linearity.

FIG. 2 shows a schematic diagram of an alternative prior-art mixer circuit 200 designed to perform signal-frequency conversion. The design of mixer circuit 200 is based on a folded mixer stage in which the V-I converter 202 is separated from the first mixer core 204. The current generated by V-I converter 202 is AC coupled through capacitors Cc into the emitter nodes (or equivalent) of the mixer core 204. The capacitors Cc block the DC bias current and allow only the AC signal current to be coupled. To work properly, the load impedance of the V-I converter 202 must be high relative to the sum of the coupling capacitor impedance and the impedance looking into the emitter nodes of the mixer core 204. The current divides through current division into the two impedances and the majority will flow into the mixer core 204, if the low-impedance requirement has been met.

If the load impedances of mixer core 204 are sufficiently high relative to the emitter nodes (or equivalent) of the second mixer core 206, the signal current will be delivered to the second mixer core 206 by current division in a fashion similar to that of the first mixing stage. This current division concept may be extended to additional mixing stages if desired.

The low-impedance requirement sets a minimum size limit on the capacitors Cc. The maximum size of the capacitors is determined by the value of the parasitic capacitance Cp of the coupling capacitor. After the signal current flows through the coupling capacitor Cc, it will further divide between the desired path into the mixer core 204 and the substrate through the parasitic capacitance Cp. To ensure that the majority of the current flows into the mixer core 204, the impedance seen looking into the parasitic capacitance Cp must be large compared to the impedance looking into the emitter nodes. This sets a maximum size limit on the parasitic capacitance Cp, and, since its size is proportional to the value of the coupling capacitor Cc, this also bounds the size of the coupling capacitor Cc. The bounds on the capacitor size limit the use of mixer circuit 200 to frequencies where the capacitor can practically be made on chip.

A goal of the present invention is to overcome the limitations of the prior art Further aspects and advantages of this invention will become apparent from the detailed description which follows.

SUMMARY OF THE INVENTION

The present invention is directed to a multi-stage mixer circuit, comprising (a) a first mixer core adapted to mix a first current with a first local-oscillator signal; (b) a second mixer core adapted to mix a second current with a second local-oscillator signal; and (c) one or more current mirrors connected between the first and second mixer cores and adapted to receive the current generated by the first mixer core and to generate the second current for the second mixer core. In one embodiment, the mixer circuit of the present invention is implemented on a single integrated circuit. Mixers of the present invention can be used as components in transmitters and receivers for radio and other communication applications.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The present invention is directed to mixer circuitry designed to convert signals from an input frequency range into an output frequency range. Like the prior-art mixer circuits of FIGS. 1 and 2, the mixer circuits of the present invention are based on sequences of mixer stages that convert the signals between the input and output frequency ranges in two or more mixing steps. However, unlike the prior-art mixer circuits of FIGS. 1 and 2, the mixer circuits of the present invention do not rely on current-to-voltage and voltage-to-current conversion between the mixer stages. Rather, current mirrors are used to process the signals between successive mixer stages.

Figure 3:
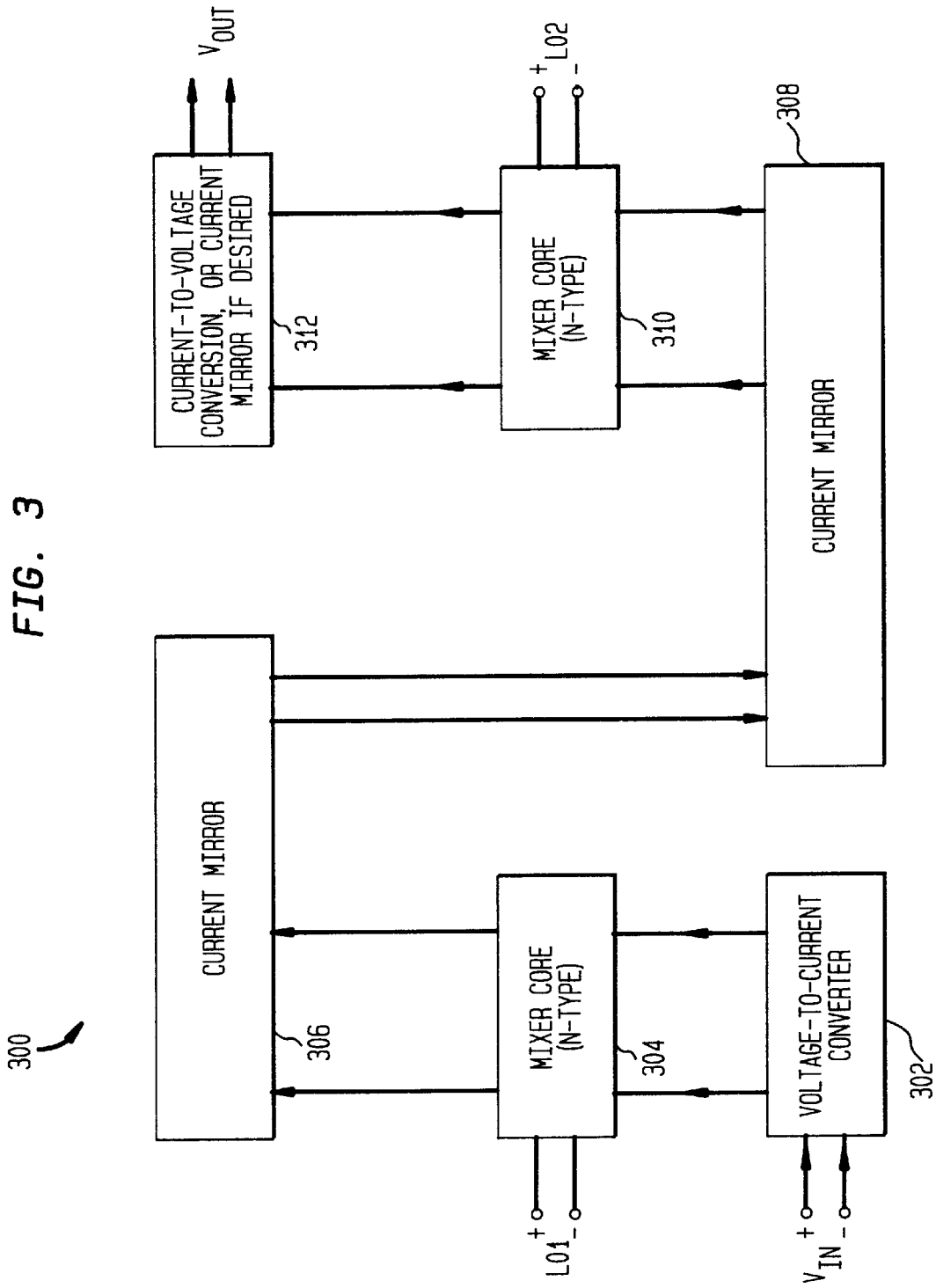
FIG. 3 shows a schematic diagram of a multi-stage mixer circuit, according to one embodiment of the present invention.

FIG. 3 shows a schematic diagram of a multi-stage mixer circuit 300, according to one embodiment of the present invention. Mixer circuit 300 converts an input voltage signal Vin in an input frequency range into an output voltage signal Vout in an output frequency range in two mixer stages.

In particular, voltage-to-current converter 302 converts the input voltage signal Vin into a current, which is mixed by first-stage mixer core 304 with a first local-oscillator signal LO1. Current mirror 306 mirrors the current generated by mixer core 304 and current mirror 308 mirrors the current generated by mirror 306 to generate a current input to second-stage mixer core 310, which mixes that current with a second local-oscillator signal LO2. The current generated by mixer core 310 can then be converted to an output voltage signal Vout by a current-to-voltage converter 312. Alternatively, element 312 could be another current mirror if a current is desired as the output of mixer circuit 300.

In a preferred implementation, mixer cores 304 and 310 are implemented using NPN bipolar transistors or NMOS transistors for high speed, and current mirrors 306 and 308 are implemented using PNP bipolar or PMOS transistors. P-type devices could be used in the mixer cores with N-type current mirrors, if lower performance mixers are acceptable. The maximum frequency of use of the invention is determined by the bandwidth of the current mirrors. Unlike the capacitor-coupling technique of folded-mixer circuit 200 of FIG. 2, mixer circuit 300 can be implemented as a single integrated circuit (IC) for operation at low frequencies.

Figure 1:
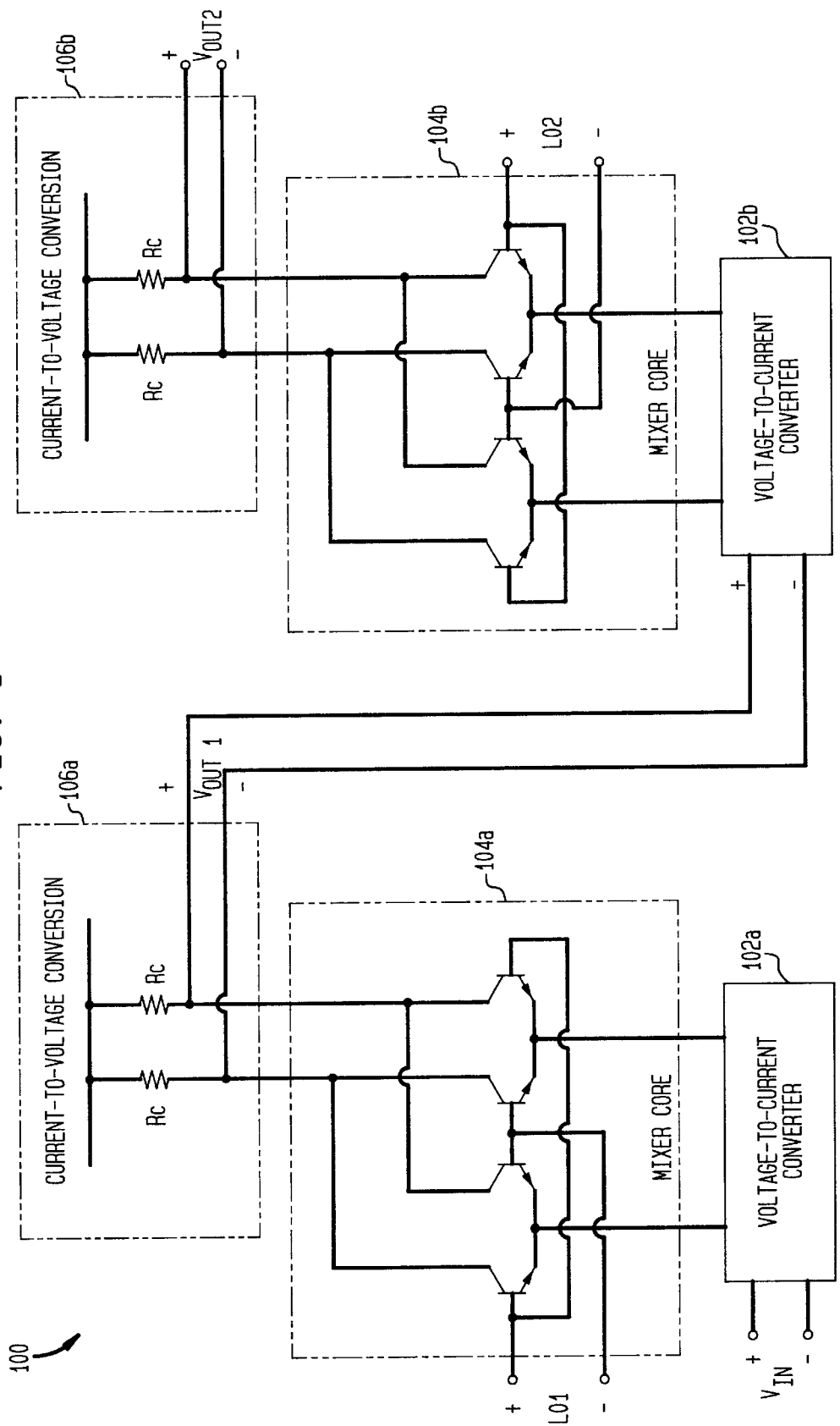
FIG. 1 shows a schematic diagram of a prior-art circuit used to convert an input voltage signal Vin in an input frequency range to an output voltage signal Vout2 in an output frequency range.
Figure 2:
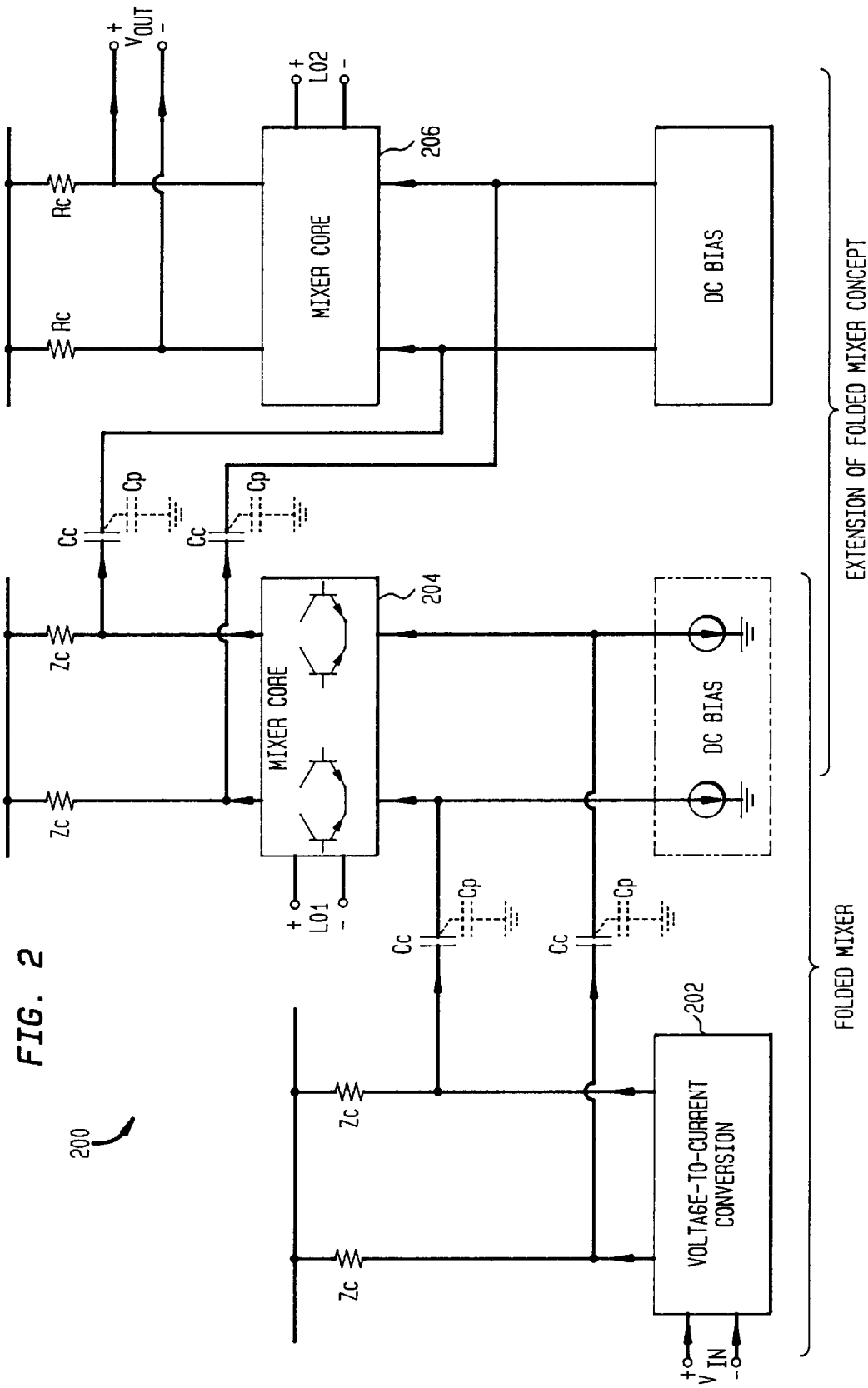
FIG. 2 shows a schematic diagram of an alternative prior-art circuit designed to perform signal-frequency conversion.

One main difference between the mixer circuits of the present invention and the prior-art mixer circuits of FIGS. 1 and 2 is that the signals generated by the first mixer stage in a mixer circuit of the present invention are not converted into voltages and then back into currents for the second mixer stage. Rather, the signals are maintained as currents between successive mixer stages. Because mixer circuit 300 avoids the repetition of voltage-to-current conversion followed by current-to-voltage conversion performed by the prior-art mixer circuits, mixer circuit 300 adds less distortion and has lower power dissipation than the prior-art mixer circuits.

Figure 4:
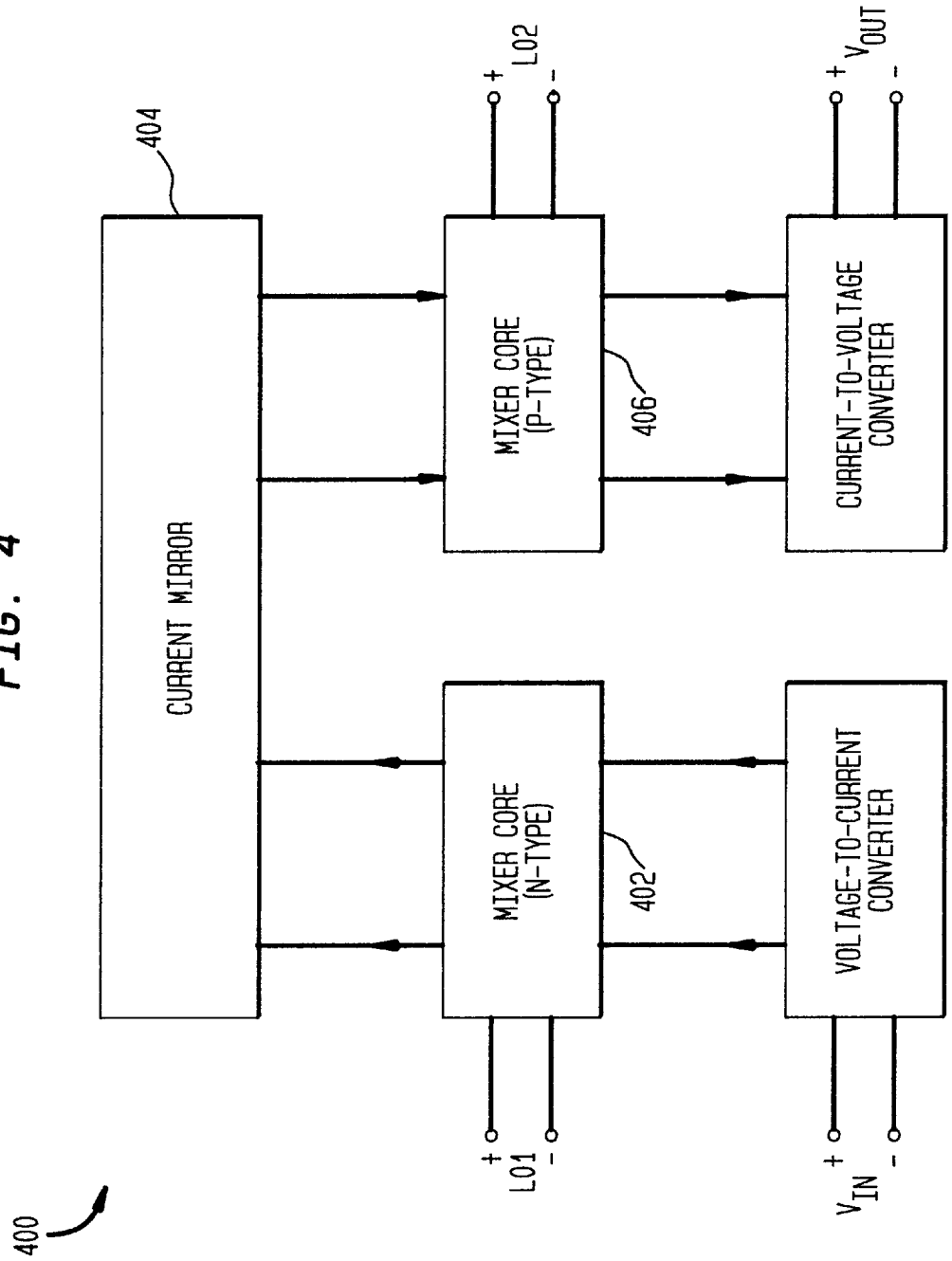
FIG. 4 shows a schematic diagram of a multi-stage mixer circuit, according to an alternative embodiment of the present invention.

FIG. 4 shows a schematic diagram of a multi-stage mixer circuit 400, according to an alternative embodiment of the present invention. Like mixer circuit 300 of FIG. 3, mixer circuit 400 converts an input voltage signal Vin in an input frequency range into an output voltage signal Vout in an output frequency range. However, mixer circuit 400 is implemented with one N-type mixer core (402) and one P-type mixer core (406). This allows mixer circuit 400 to be implemented with a single current mirror 404. It will be understood that mixer circuit 400 could also be implemented with a first-stage P-type mixer core and a second-stage N-type mixer core. Both of these embodiments of the present invention are useful when P-type mixer performance is adequate. In general, when successive mixer stages are implemented with the same type of transistor devices (e.g., both N-type), an even number of current mirrors are used between the mixer stages. Similarly, when successive mixer stages are implemented with different types of transistor devices (i.e., one N-type and the other P-type), an odd number of current mirrors are used between the mixer stages.

Figure 5:
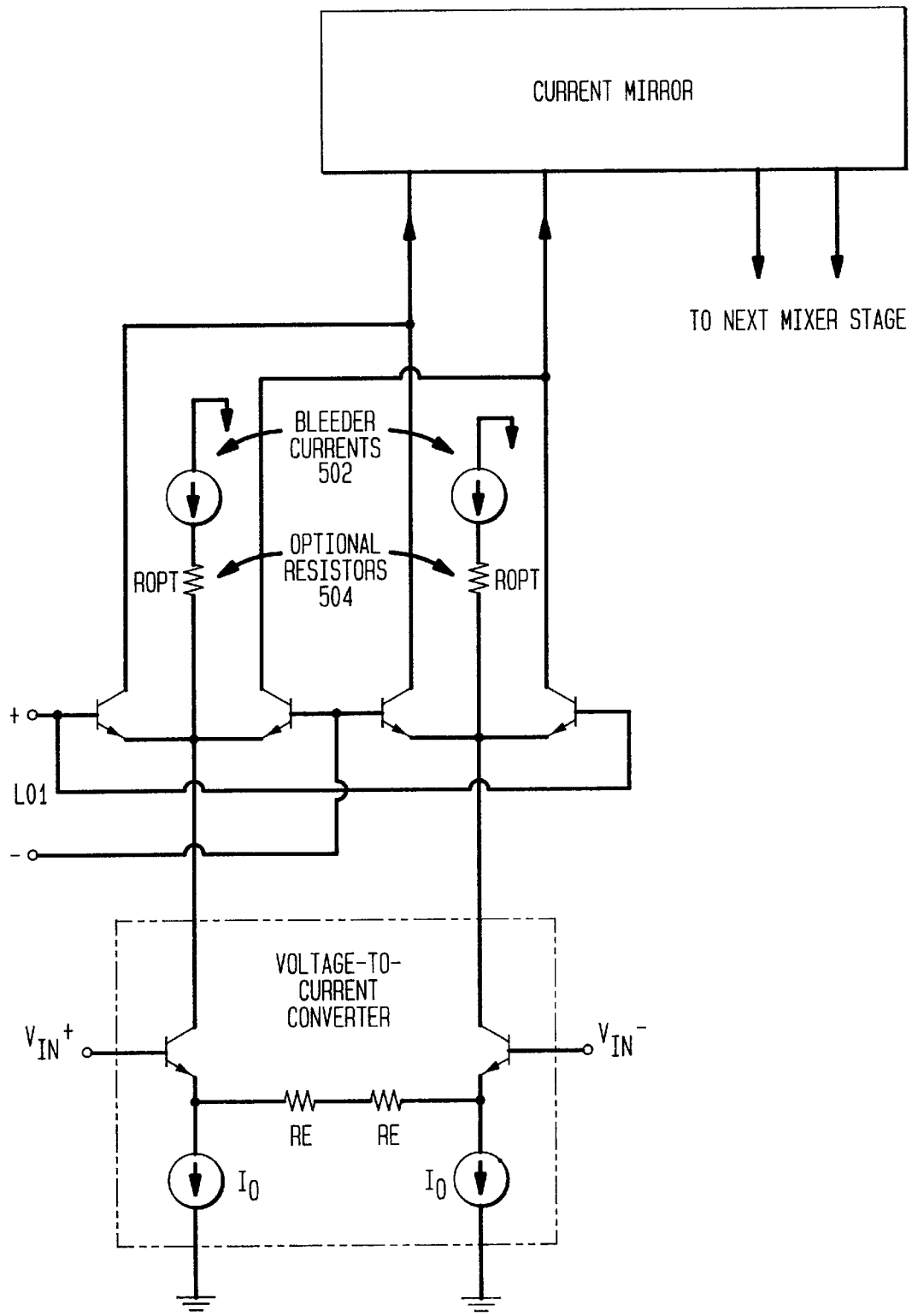
FIG. 5 shows a schematic diagram of one stage of the mixer circuit of FIG. 3, according to one embodiment of the present invention.

FIG. 5 shows a schematic diagram of one stage of mixer circuit 300 of FIG. 3, according to one implementation of the present invention. It will be understood that, in general, the gain of mixer circuit 300 of FIG. 3 can be easily set through appropriate scaling in current mirrors 306 and 308. One disadvantage of scaling the gain in this manner is that the DC bias current is also scaled. FIG. 5 shows a technique that could be used to address this DC-bias-current scaling problem. As shown in FIG. 5, a "bleeder" current source 502 is added to remove some of the DC current that flows into each pair of transistors in the mixer core. The output impedance of the current source should be high relative to the emitter impedances so that the AC current continues to flow through the switching devices and into the mirror loads, but the DC current that flows into the mirrors will be reduced. Since a current source will have some capacitance associated with it, a series resistor 504 between the emitter node and the current source will help to ensure that the impedance looking toward the current source remains high.

Although the mixer circuits shown in FIGS. 3 and 4 have two mixer stages, it will be understood that the concepts of the present invention can be extended to mixer circuits having three or more mixer stages. Mixers in accordance with the present invention can be used as components in transducers, such as transmitters, receivers, and transceivers designed for radio and/or other communication applications.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A multi-stage mixer circuit, comprising:
    (a) a first mixer core adapted to mix a first current with a first local-oscillator signal;
    (b) a second mixer core adapted to mix a second current with a second local-oscillator signal; and
    (c) one or more current mirrors connected between the first and second mixer cores and adapted to receive the current generated by the first mixer core and to generate the second current for the second mixer core.

2. The invention of claim 1, wherein no current-to-voltage conversion and no voltage-to-current conversion is performed between the first and second mixer cores.

3. The invention of claim 1, wherein the first and second mixer cores are implemented with the same type of transistor devices and there are an even number of current mirrors connected between the first and second mixer cores.

4. The invention of claim 3, wherein there are exactly two current mirrors connected between the first and second mixer cores.

5. The invention of claim 3, wherein the first and second mixers are implemented with N-type transistor devices.

6. The invention of claim 5, wherein the first and second mixers are implemented with either NPN bipolar transistors or NMOS transistors, and the current mirrors are implemented with either PNP bipolar transistors or PMOS transistors.

7. The invention of claim 1, wherein the first and second mixer cores are implemented with opposite types of transistor devices and there are an odd number of current mirrors connected between the first and second mixer cores.

8. The invention of claim 7, wherein there is exactly one current mirror connected between the first and second mixer cores.

9. The invention of claim 1, wherein the multi-stage mixer circuit is implemented on a single integrated circuit.

10. The invention of claim 1, further comprising a voltage-to-current converter adapted to convert an input voltage signal into the first current.

11. The invention of claim 1, further comprising a current-to-voltage converter adapted to convert the current generated by the second mixer into an output voltage signal.

12. The invention of claim 1, further comprising an output current mirror adapted to mirror the current generated by the second mixer.

13. The invention of claim 1, further comprising one or more additional mixer cores, wherein each additional mixer core is connected to a previous mixer core through one or more current mirrors.

14. The invention of claim 1, wherein at least one mixer core comprises one or more bleeder current sources adapted to reduce DC current flow through the mixer core.

15. The invention of claim 14, wherein a series resistor is connected between each bleeder current source and an emitter node of the corresponding mixer core to help ensure that the impedance looking toward the bleeder current source remains high.

16. An integrated circuit having a multi-stage mixer circuit, the mixer circuit comprising:

(a) a first mixer core adapted to mix a first current with a first local-oscillator signal;

(b) a second mixer core adapted to mix a second current with a second local-oscillator signal; and (c) one or more current mirrors connected between the first and second mixer cores and adapted to receive the current generated by the first mixer core and to generate the second current for the second mixer core.

17. The invention of claim 16, wherein no current-to-voltage conversion and no voltage-to-current conversion is performed between the first and second mixer cores.

18. The invention of claim 16, wherein the first and second mixer cores are implemented with the same type of transistor devices and there are an even number of current mirrors connected between the first and second mixer cores.

19. The invention of claim 18, wherein there are exactly two current mirrors connected between the first and second mixer cores.

20. The invention of claim 18, wherein the first and second mixers are implemented with N-type transistor devices.

21. The invention of claim 20, wherein the first and second mixers are implemented with either NPN bipolar transistors or NMOS transistors, and the current mirrors are implemented with either PNP bipolar transistors or PMOS transistors.

22. The invention of claim 16, wherein the first and second mixer cores are implemented with opposite types of transistor devices and there are an odd number of current mirrors connected between the first and second mixer cores.

23. The invention of claim 22, wherein there is exactly one current mirror connected between the first and second mixer cores.

24. The invention of claim 16, further comprising a voltage-to-current converter adapted to convert an input voltage signal into the first current.

25. The invention of claim 16, further comprising a current-to-voltage converter adapted to convert the current generated by the second mixer into an output voltage signal.

26. The invention of claim 16, further comprising an output current mirror adapted to mirror the current generated by the second mixer.

27. The invention of claim 16, further comprising one or more additional mixer cores, wherein each additional mixer core is connected to a previous mixer core through one or more current mirrors.

28. The invention of claim 16, wherein at least one mixer core comprises one or more bleeder current sources adapted to reduce DC current flow through the mixer core.

29. The invention of claim 28, wherein a series resistor is connected between each bleeder current source and an emitter node of the corresponding mixer core to help ensure that the impedance looking toward the bleeder current source remains high.

30. A transducer having a multi-stage mixer circuit, the mixer circuit comprising:

(a) a first mixer core adapted to mix a first current with a first local-oscillator signal;

(b) a second mixer core adapted to mix a second current with a second local-oscillator signal; and (c) one or more current mirrors connected between the first and second mixer cores and adapted to receive the current generated by the first mixer core and to generate the second current for the second mixer core.

31. The invention of claim 30, wherein no current-to-voltage conversion and no voltage-to-current conversion is performed between the first and second mixer cores.

32. The invention of claim 30, wherein the first and second mixer cores are implemented with the same type of transistor devices and there are an even number of current mirrors connected between the first and second mixer cores.

33. The invention of claim 30, wherein the first and second mixer cores are implemented with opposite types of transistor devices and there are an odd number of current mirrors connected between the first and second mixer cores.

34. The invention of claim 30, further comprising a voltage-to-current converter adapted to convert an input voltage signal into the first current.

35. The invention of claim 30, further comprising a current-to-voltage converter adapted to convert the current generated by the second mixer into an output voltage signal.

36. The invention of claim 30, further comprising an output current mirror adapted to mirror the current generated by the second mixer.

37. The invention of claim 30, wherein the transducer is one of a transmitter, a receiver, and a transceiver.

* * * * *